(12) United States Patent
Hong et al.

(10) Patent No.: US 12,272,647 B2
(45) Date of Patent: Apr. 8, 2025

(54) 3D STACKED CHIP THAT SHARES POWER RAILS

(71) Applicant: SAMSUNG ELECTRONICS CO., LTD., Suwon-si (KR)

(72) Inventors: Byounghak Hong, Albany, NY (US); Kang-ill Seo, Albany, NY (US); Jason Martineau, Fremont, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 339 days.

(21) Appl. No.: 17/720,642

(22) Filed: Apr. 14, 2022

(65) Prior Publication Data

US 2023/0253324 A1 Aug. 10, 2023

Related U.S. Application Data

(60) Provisional application No. 63/308,692, filed on Feb. 10, 2022.

(51) Int. Cl.
*H01L 23/528* (2006.01)
*H01L 23/00* (2006.01)
(Continued)

(52) U.S. Cl.
CPC .......... *H01L 23/5286* (2013.01); *H01L 24/08* (2013.01); *H01L 24/80* (2013.01);
(Continued)

(58) Field of Classification Search
CPC ..... H01L 23/5286; H01L 24/08; H01L 24/80; H01L 25/0657; H01L 25/50
See application file for complete search history.

(56) References Cited

U.S. PATENT DOCUMENTS 9,006,892 B2 4/2015 Ching
9,230,941 B2 1/2016 Chen et al.
(Continued)

FOREIGN PATENT DOCUMENTS

CN 112542378 A 3/2021
CN 113257779 B 9/2021
(Continued)

OTHER PUBLICATIONS

G. Sisto et al., "IR-Drop Analysis of Hybrid Bonded 3D-ICs with Backside Power Delivery and µ- & n-TSVs", 2021 IEEE International Interconnect Technology Conference(IITC), DOI: 10.1109/IITC51362.2021.9537541, Jul. 2021, 3 pages total.
(Continued)

*Primary Examiner* — Michael Jung
(74) *Attorney, Agent, or Firm* — Sughrue Mion, PLLC

(57) ABSTRACT

Provided is a three-dimensionally (3D) stacked semiconductor chip architecture including a first semiconductor chip including a first wafer, a first front-end-of-line (FEOL) layer provided on a first side of the first wafer, a first middle-of-line (MOL) layer provided on the first FEOL layer, a first back-end-of-line (BEOL) layer provided on the first MOL layer, a first power rail layer provided on a second side of the first wafer, and a second semiconductor chip including a second wafer, a second FEOL layer provided on a first side of the second wafer, a second MOL layer provided on the second FEOL layer, a second BEOL layer provided on the second MOL layer, a second power rail layer provided on a second side of the second wafer, wherein the first power rail layer and the second power rail layer contact each other.

11 Claims, 13 Drawing Sheets

(51) Int. Cl.
  *H01L 25/00* (2006.01)
  *H01L 25/065* (2023.01)
(52) U.S. Cl.
  CPC .......... *H01L 25/0657* (2013.01); *H01L 25/50* (2013.01); *H01L 2224/08145* (2013.01); *H01L 2224/80895* (2013.01); *H01L 2224/80896* (2013.01)

(56) References Cited

U.S. PATENT DOCUMENTS

| | | | |
|---|---|---|---|
| 9,343,369 B2* | 5/2016 | Du | ................ H01L 23/528 |
| 10,163,750 B2 | 12/2018 | Yu et al. | |
| 10,672,820 B2 | 6/2020 | Tsai | |
| 10,727,205 B2* | 7/2020 | Wu | ................ H01L 24/83 |
| 10,930,619 B2 | 2/2021 | Ye | |
| 11,037,817 B2* | 6/2021 | Pancholi | ................ H01L 24/17 |
| 2006/0121690 A1 | 6/2006 | Pogge et al. | |
| 2020/0135735 A1* | 4/2020 | Sengupta | ............ H01L 29/785 |
| 2021/0343650 A1 | 11/2021 | Peng et al. | |
| 2021/0343744 A1 | 11/2021 | Chiu et al. | |
| 2021/0358891 A1 | 11/2021 | Chuang et al. | |
| 2022/0181263 A1* | 6/2022 | Liebmann | ......... H01L 21/76898 |
| 2023/0005943 A1* | 1/2023 | Zhang | ................ H01L 25/18 |
| 2024/0063183 A1* | 2/2024 | Elsherbini | ............ H01L 24/16 |
| 2024/0290715 A1* | 8/2024 | Maki | ................ H01L 25/0657 |

FOREIGN PATENT DOCUMENTS

| | | |
|---|---|---|
| CN | 113629043 A | 11/2021 |
| KR | 10-1729378 B1 | 4/2017 |

OTHER PUBLICATIONS

Anshul Gupta et al., "Buried Power Rail Integration With FinFETs for Ultimate CMOS Scaling", IEEE Transactions on Electron Devices, vol. 67, No. 12, Dec. 2020, 6 pages total.

Md Obaidul Hossen et al., "Power Delivery Network (PDN) Modeling for Backside-PDN Configurations With Buried Power Rails and μTSVs", IEEE Transactions on Electron Devices, vol. 67, No. 1, Dec. 2019, 7 pages total.

Kazuki Monta et al., "3-D CMOS Chip Stacking for Security ICs Featuring Backside Buried Metal Power Delivery Networks With Distributed Capacitance", IEEE Transactions on Electron Devices, vol. 68, No. 4, Feb. 2021, 6 pages total.

Communication dated Jul. 17, 2023, issued by the European Patent Office in European Application No. 23150135.4.

* cited by examiner

3D STACKED CHIP THAT SHARES POWER RAILS

CROSS-REFERENCE TO RELATED APPLICATION

This application is based on and claims benefit to U.S. Provisional Application No. 63/308,692 filed on Feb. 10, 2022 in the U.S. Patent and Trademark Office, the disclosure of which is incorporated herein in its entirety by reference.

BACKGROUND

1 Field

Example embodiments of the present disclosure relate to a three-dimensionally (3D) stacked semiconductor chip architecture that shares back side power distribution rails and a method of manufacturing the same.

2. Description of Related Art

A 3D stacked semiconductor chip architecture including multiple stacks of semiconductor chips are being developed to stack multiple transistors within a limited area with a compact size. However, for a semiconductor chip including a carrier wafer and a front-end-of-line (FEOL) layer, a middle-of-line (MOL) layer, and a back-end-of-line (BEOL) layer stacked on the carrier wafer, a limit in the aspect ratio of vias connecting different stacks of semiconductor chips makes it difficult to stack multiple semiconductor chips.

In addition, when stacking the semiconductor chips according to the related art, misalignment between the stacked semiconductor chips may occur due to the complex structure of the BEOL layers which may be bonded together.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a three-dimensionally (3D) stacked semiconductor chip architecture and a method of manufacturing the same.

According to an aspect of an example embodiment, there is provided a 3D stacked semiconductor chip architecture including a first semiconductor chip including a first wafer, a first FEOL layer provided on a first side of the first wafer, a first MOL layer provided on the first FEOL layer, a first BEOL layer provided on the first MOL layer, a first power rail layer provided on a second side of the first wafer, and a second semiconductor chip including a second wafer, a second FEOL layer provided on a first side of the second wafer, a second MOL layer provided on the second FEOL layer, a second BEOL layer provided on the second MOL layer, a second power rail layer provided on a second side of the second wafer, wherein the first power rail layer and the second power rail layer contact each other.

According to another aspect of an example embodiment, there is provided a method of manufacturing a 3D stacked semiconductor chip architecture, the method including providing a first semiconductor structure including providing a first wafer, providing a first front-end-of-line (FEOL) layer on a first side of the first wafer, providing a first middle-of-line (MOL) layer on the first FEOL layer, providing a first back-end-of-line (BEOL) layer on the first MOL layer, flipping the first wafer, and providing a first power rail layer on a second side of the first wafer, providing a second semiconductor chip including providing a second wafer, providing a second front-end-of-line (FEOL) layer on a first side of the second wafer, providing a second middle-of-line (MOL) layer on the second FEOL layer, providing a second back-end-of-line (BEOL) layer on the second MOL layer, flipping the second wafer, and providing a second power rail layer on a second side of the second wafer, flipping the second semiconductor chip, and bonding the second semiconductor chip to the first semiconductor chip such that the second power rail layer contacts the first power rail layer.

According to another aspect of an example embodiment, there is provided a 3D stacked semiconductor chip architecture including a first semiconductor chip including a first wafer, a first front-end-of-line (FEOL) layer provided on a first side of the first wafer, a first middle-of-line (MOL) layer provided on the first FEOL layer, a first back-end-of-line (BEOL) layer provided on the first MOL layer, a plurality of first power rails provided on a second side of the first wafer, the plurality of first power rails configured to distribute power, a second semiconductor chip including a second wafer, a second FEOL layer provided on a first side of the second wafer, a second MOL layer provided on the second FEOL layer, a second BEOL layer provided on the second MOL layer, a plurality of second power rails provided on a second side of the second wafer, the plurality of second power rails configured to distribute power, wherein the first power rail layer and the second power rail layer contact each other, wherein the first power rails protrude from the second side of the first wafer in a vertical direction, and wherein the second power rails comprise openings that extend through a portion of the second wafer in the vertical direction.

BRIEF DESCRIPTION OF DRAWINGS

The above and/or other aspects, features, and advantages of example embodiments of the disclosure will be more apparent from the following description taken in conjunction with the accompanying drawings, in which.

DETAILED DESCRIPTION

Figure 1:
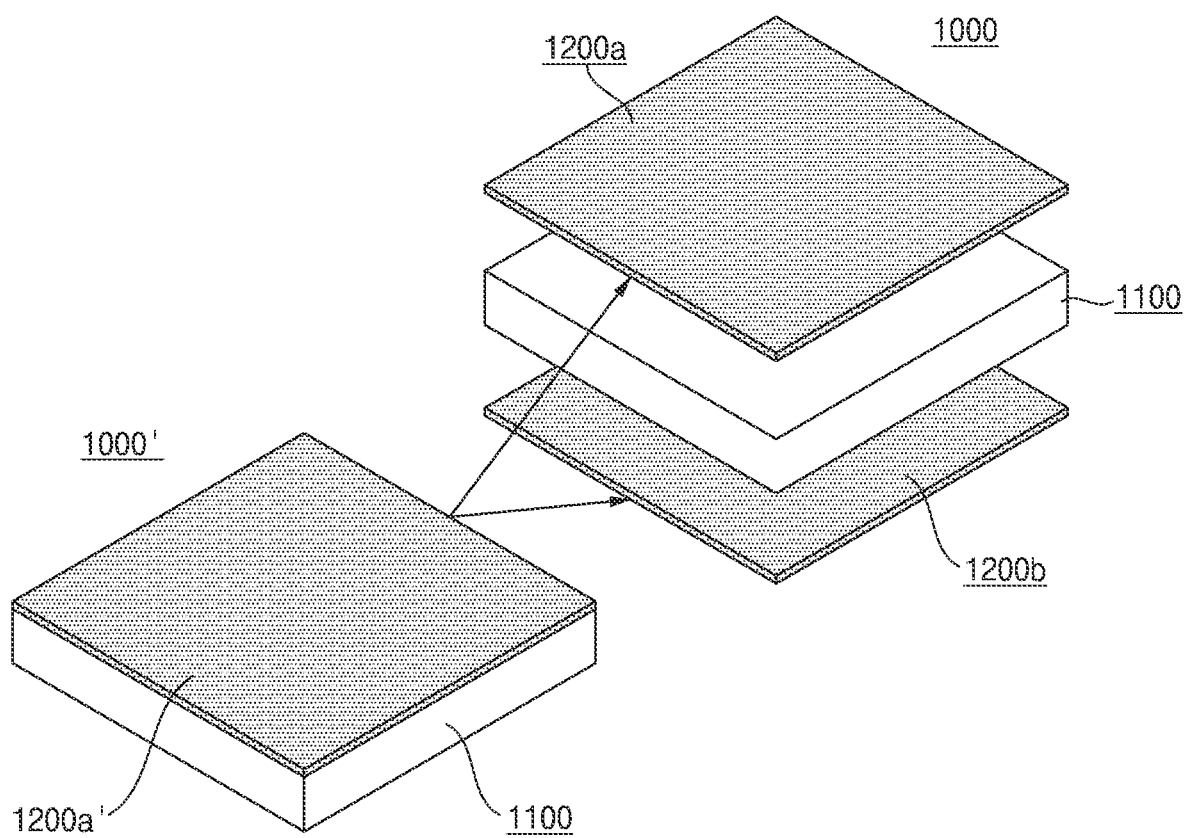
FIG. 1 illustrates a perspective view of a general power distribution network (PDN) semiconductor architecture according to a related art and a back side power distribution network (BSPDN) semiconductor architecture according to an example embodiment.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

Hereinafter, embodiments will be explained in detail with reference to the accompanying drawings. Embodiments described herein are example embodiments, and thus, the disclosure is not limited thereto.

FIG. 1 illustrates a perspective view of a general power distribution network (PDN) semiconductor chip according to a related art, and a back side power distribution network (BSPDN) semiconductor chip according to an embodiment.

Referring to FIG. 1, a general PDN semiconductor chip 1000' includes a PDN/signal wiring layer 1200a' formed on one side (front side) of the wafer 1100. However, this configuration of the general PDN semiconductor chip 1000' may cause routing congestion in the PDN/signal wiring layer 1200a' and increase a size of the general PDN semiconductor chip 1000'. In addition, a resistance of the general PDN semiconductor chip 1000' may be relatively high.

As illustrated in FIG. 1, in a BSPDN semiconductor chip 1000 according to an embodiment, a signal wiring layer 1200a may be provided on a first side (front side) of the wafer 1100, and a power distribution network (PDN) layer 1200b may be provided on a second side (back side) of the wafer 1100 opposite to the signal wiring layer 1200a. The BSPDN semiconductor chip 1000 according to the present embodiment may reduce routing congestion and a size of the BSPDN semiconductor chip 1000 by removing the PDN from the first side of the wafer 1100, and hence form a more simplified PDN layer 1200b may be provided on the second side of the wafer 1100.

It is understood that although the signal wiring layer 1200a and the PDN layer 1200b are respectively separated from the wafer 1100 to have a space therebetween in FIG. 1, this separation is only for illustration purposes to show the PDN/signal wiring layer 1200a' of the related art is to be separated in the present embodiment. Thus, at least one of these two layers may be bonded to or otherwise integrated with the wafer 1100, or one or more intervening layers may be provided therebetween, according to embodiments.

Figure 2A:
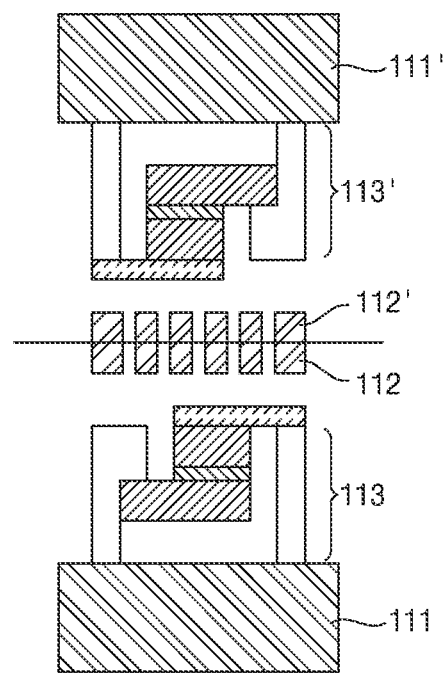
FIG. 2A illustrates a three-dimensionally (3D) stacked semiconductor chip architecture according to the related art.

FIG. 2A illustrates a three-dimensionally (3D) semiconductor chip architecture according to a related art.

Referring to FIG. 2A, the 3D stacked semiconductor chip architecture 1110' may include a first semiconductor chip and a second semiconductor chip stacked on the first semiconductor chip. The first semiconductor chip may include a carrier wafer (handler wafer) 111, a semiconductor layer 113 including an FEOL layer and an MOL layer, and a BEOL layer including metal patterns 112.

Herein, the FEOL layer may refer to a layer or elements that include primary structures of a semiconductor device (e.g., transistor) such as an epitaxial layer (e.g., source/drain region), a fin structure (channel), and a gate electrode, and the MOL layer may refer to a layer or elements that include contact structures such as a source/drain contact plug, a gate contact plug and corresponding vias of the semiconductor device. Further, the BEOL layer may refer to a layer of elements that include metal patterns or contact structures, connected to a voltage source or used for signal routing from/to another circuit element, and vias connecting the metal patterns or contact structure to the MOL elements or structures.

The second semiconductor chip may include a carrier wafer 111', a semiconductor layer 113' including an FEOL layer and an MOL layer, and a BEOL layer including metal patterns 112'.

The second semiconductor chip may be flipped such that the metal patterns 112' face the metal patterns 112 of the first semiconductor chip, and the second semiconductor chip may be bonded to the first semiconductor chip to form a 3D semiconductor chip architecture 1110'.

However, in the related art, an accurate alignment of the metal patterns 112 of the first semiconductor chip with the metal patterns 112' of the second semiconductor chip may be difficult because the BEOL layers of the first semiconductor chip and the second semiconductor chip include various metal lines and metal patterns forming a complicated structure with small feature sizes.

Such misalignment between the first semiconductor chip and the second semiconductor chip may eventually degrade the quality of the 3D stacked semiconductor chip architecture 1110' according to the related art.

Figure 2B:
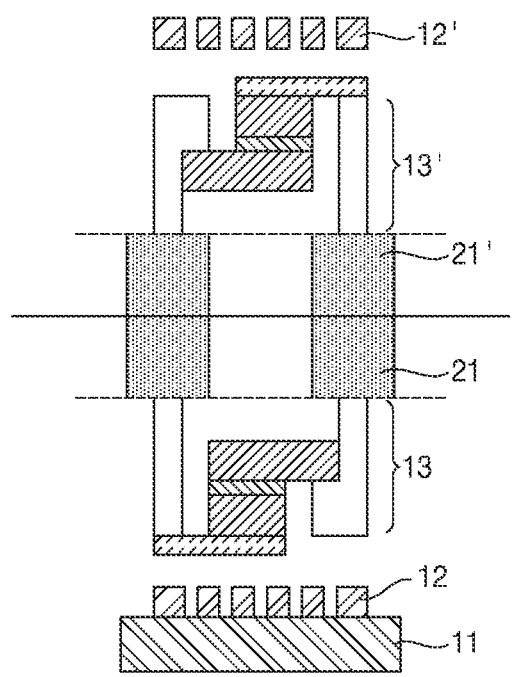
FIG. 2B illustrates a 3D stacked semiconductor chip architecture according to an example embodiment.

FIG. 2B illustrates a 3D stacked semiconductor chip architecture according to an embodiment.

Referring to FIG. 2B, a 3D stacked semiconductor chip architecture 1110 may include a first BSPDN semiconductor chip and a second BSPDN semiconductor chip stacked on the first BSPDN semiconductor chip. The first BSPDN semiconductor chip may include a carrier wafer 11, a semiconductor layer 13 including an FEOL layer and an MOL layer, and a portion of a BEOL layer provided on a top side (front side) of the semiconductor layer 13. The BEOL layer may include metal patterns 12. In FIG. 2B, the metal patterns 12 included in the BEOL layer may be provided on the carrier wafer 11.

The first BSPDN semiconductor chip may also include a portion of a back side BEOL layer including a PDN layer that includes back side power rails 21 provided on a bottom side (back side) of the semiconductor layer 13 opposite to the metal patterns 12. The back side power rails 21 may be connected to a voltage source. Thus, in the present embodiment, the BEOL layer may be divided into two BEOL layers with the FEOL layer and the MOL layer therebetween.

A second BSPDN semiconductor chip may include a semiconductor layer 13' including an FEOL layer and a MOL layer, and a portion of a BEOL layer provided on a top side of the semiconductor layer 13'. The BEOL layer may include metal patterns 12'. In addition, the second BSPDN semiconductor chip may include a portion of a back side BEOL layer including a PDN layer that includes back side power rails 21' provided on a bottom side of the semiconductor layer 13' opposite to the metal patterns 12'. The back side power rails 21' may be connected to a voltage source.

The second BSPDN semiconductor chip may be flipped such that the back side power rails 21' face the back side power rails 21 of the first BSPDN semiconductor chip. The second BSPDN semiconductor structure is bonded to the first BSPDN semiconductor chip to form a 3D stacked semiconductor chip architecture 1110.

In the 3D stacked semiconductor chip 1110 according to the embodiment, the back side power rails 21 formed on a back side of the first BSPDN semiconductor chip, which are separated from the signal wiring layer of the first BSPDN, and back side power rails 21' formed on a back side of the second BSPDN semiconductor chip, which are separated from the signal wiring layer of the second BSPDN, may be directly bonded to each other, without any metal patterns therebetween, and thus, may be shared. As the back side power rails 21 and the back side power rails 21' have a more simplified structure and a larger feature size compared to the metal wires and metal patterns 112 and 112' included in the BEOL layer of the related art in FIG. 2A, the bonding process may be simplified and an alignment between the back side power rails 21 and back side power rails 21' may be improved compared to the 3D stacked semiconductor chip architecture 1110' according to the related art. Such improvement in the alignment of the back side power rails 21 included in the first BSPDN semiconductor chip with the back side power rails 21' included in the second BSPDN semiconductor chip may lead to an improvement in the quality of the 3D stacked semiconductor chip architecture 1110 according to the present embodiment. In addition, a number of carrier wafers required may be reduced as the second BSPDN semiconductor chip that is stacked on the first BSPDN semiconductor chip does not require an additional carrier wafer, and the number of times the semiconductor chip is flipped may be reduced.

Figure 3:
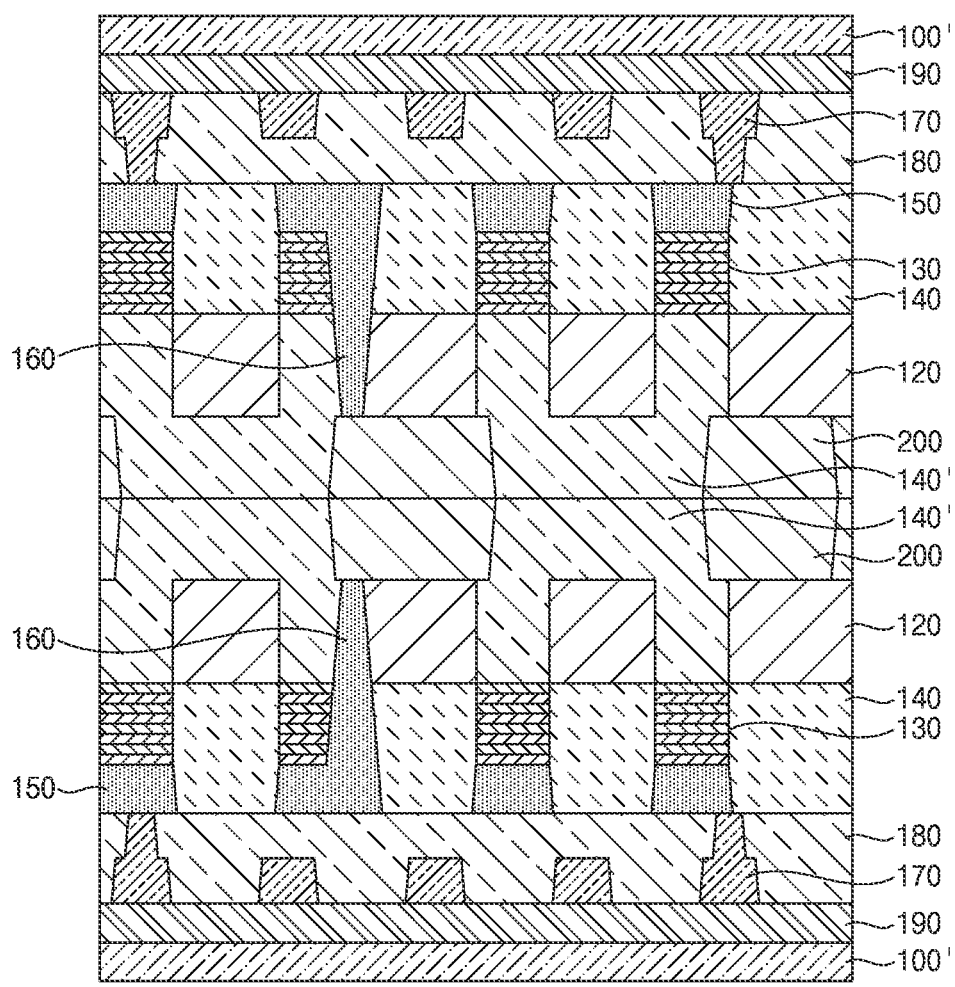
FIG. 3 illustrates a 3D stacked semiconductor chip architecture according to an example embodiment.

FIG. 3 illustrates a 3D stacked semiconductor chip architecture according to an embodiment.

Referring to FIG. 3, the 3D stacked semiconductor chip architecture 1 may include a first BSPDN semiconductor chip and a second BSPDN semiconductor chip stacked on the first BSPDN semiconductor chip.

The first BSPDN semiconductor chip may include a carrier wafer 100', a BEOL layer 190 which may be a metal pattern, BEOL contact structure and vias 170, and an inter-dielectric layer 180. The BEOL vias 170 may extend from the BEOL layer to an MOL layer. The inter-dielectric layer 180 may fill the space between the BEOL contact structure and vias 170. The first BSPDN semiconductor chip may further include MOL contact structures 150 in the MOL layer and an MOL via 160 extending from the MOL layer into an FEOL layer. Another inter-dielectric layer 140 may be provided on side surfaces of the MOL contact structures 150 to fill the spaces between the MOL contact structures 150 and the MOL via 160. The MOL contact structures 150 and the MOL via 160 may include conductive materials.

The first BSPDN semiconductor chip may also include an FEOL layer. The FEOL layer may include the semiconductor devices 130 and shallow trench isolation (STI) structures 120. Here, the semiconductor devices 130 may include one or more transistors including epitaxial layers, fin structures, gate structures, etc. The STI structures 120 may include silicon oxide (SiO) or silicon nitride (SiN), not being limited thereto. Another inter-dielectric layer 140' may be provided on the STI structures 120. The inter-dielectric layer 140, 140' or 180 may also be formed of SiO or SiN, the same as or different from the material forming the STI structures 120.

The first BSPDN semiconductor chip may further include a PDN layer including back side power rails 200. While the BEOL layer 190 is provided on a first side of the first BSPDN semiconductor chip, the PDN layer may be provided on a second side (back side), opposite to the first side, of the first BSPDN semiconductor chip. The back side power rails 200 may be formed by filling trenches formed in the inter-dielectric layer 140' with a metal material. The back side power rails 200 may include, for example, copper (Cu), cobalt (Co), tungsten (W), molybdenum (Mo), and ruthenium (Ru), not being limited thereto. The MOL via 160 may extend to a level of a top surface of the STI structures 120 in a vertical direction and contact the back side power rails 200.

The second BSPDN semiconductor chip may have substantially the same configuration as the first BSPDN semiconductor chip described above, and thus, detailed descriptions thereof are omitted.

The second BSPDN semiconductor chip may be flipped and stacked on the first BSPDN semiconductor chip such that the back side power rails 200 of the second BSPDN semiconductor chip are bonded to the back side power rails 200 of the first BSPDN semiconductor chip.

In the 3D stacked semiconductor chip architecture 1 according to the present embodiment, as the back side power rails 200 have a more simplified structure compared to a BEOL layer of the related art, the alignment between the back side power rails 200 of the first BSPDN semiconductor chip and the back side power rails 200 of the second BSPDN semiconductor chip may be improved which may lead to an improvement in the performance and quality of the 3D stacked semiconductor chip architecture 1.

FIGS. 4A through 4I illustrate a method of manufacturing a 3D stacked semiconductor chip architecture according to an embodiment.

Figure 4A:
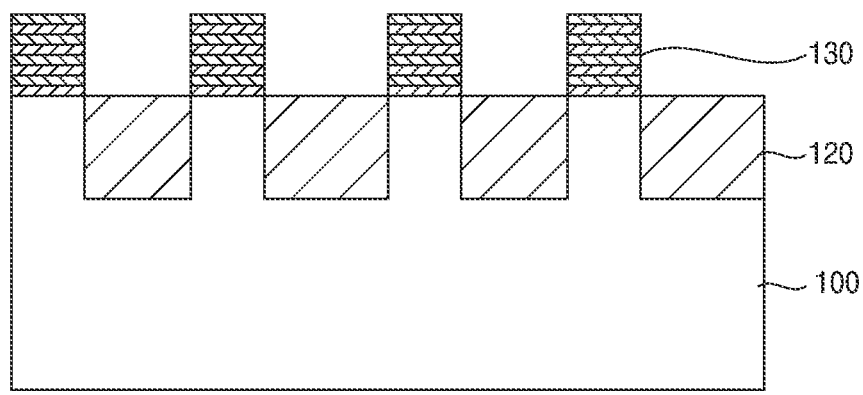
FIGS. 4A, 4B, 4C, 4D, 4E, 4F, 4G, 4H, and 4I illustrate a method of manufacturing a 3D stacked semiconductor chip architecture according to an example embodiment.

Referring to FIG. 4A, the method may include providing a device substrate (wafer) 100. The device substrate 100 may) be formed of a semiconductor material, for example, silicon (Si), or may be part of a silicon-on-insulator (SOI) substrate, not being limited thereto. An STI structures 120 may be formed in the device substrate 100. The STI structures 120 may be spaced apart from each other in a horizontal direction, and may include SiO or SiN, not being limited thereto. Semiconductor devices 130 may be formed from the device substrate 100, and may be isolated from one another by the STI structures 120. The semiconductor devices 130 may include transistors. Each of the transistors may include an epitaxial layer which may be source/drain regions, fins forming channel structures, and a gate structure, not being limited thereto. The transistors described herebelow may be one or more FinFETs, nanowire transistors, nanosheet transistors, etc.

Figure 4B:
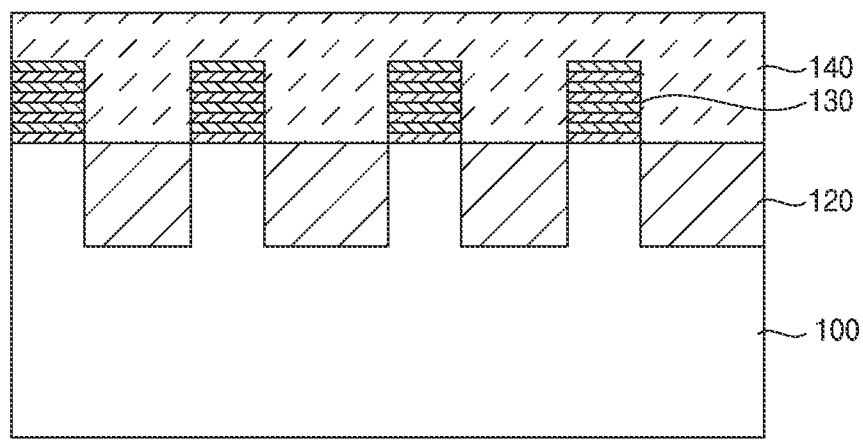

Referring to FIG. 4B, an inter-dielectric layer 140 may be formed on the STI structures 120 and the semiconductor device 130. The inter-dielectric layer 140 may be formed on the semiconductor device 130 and the top surfaces of the STI structures 120.

Figure 4C:
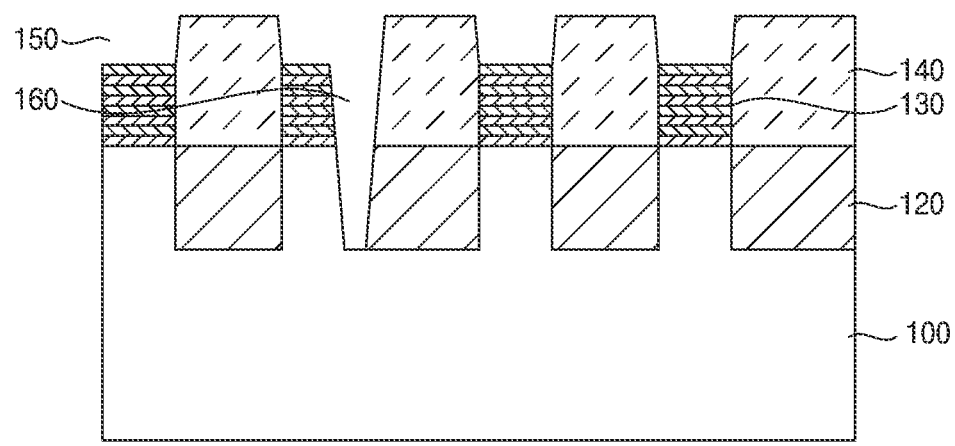

Referring to FIG. 4C, the inter-dielectric layer 140 and the STI structures 120 may be patterned to form trenches.

Figure 4D:
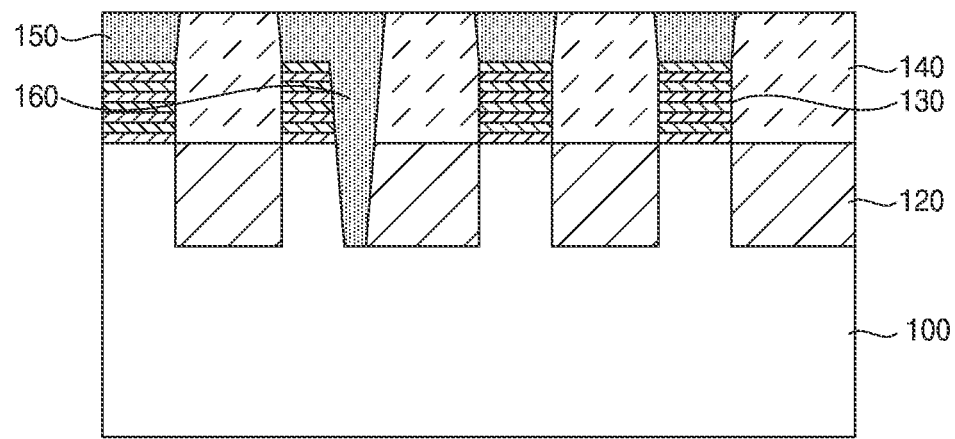

Referring to FIG. 4D, the trenches may be filled with a conductive material to form an MOL via 160 and MOL contact structures 150. The MOL via 160 may extend through the inter-dielectric layer 140 and the STI structure 120. A bottom surface of the MOL via 160 may be coplanar with a bottom surface of the STI structures 120. The MOL contact structures 150 may contact the semiconductor devices 130. The MOL contact structure 150 and the MOL via 160 may be integrally formed.

Figure 4E:
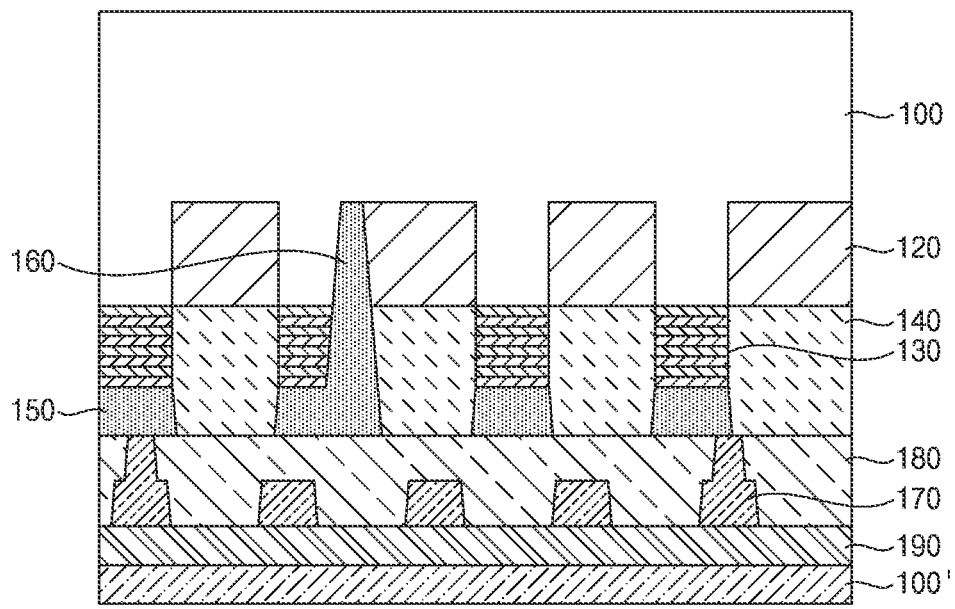

Referring to FIG. 4E, a carrier wafer 100' may be provided. The carrier wafer 100' may include silicon (Si). A BEOL layer 190 may be formed on the carrier wafer 100'. BEOL contact structures and vias 170 may be formed on the BEOL layer 190, and an inter-dielectric layer 180 may be formed on the BEOL contact structures and vias 170 and a top side of the BEOL layer 190.

The semiconductor chip shown in FIG. 4D may be flipped and attached to the inter-dielectric layer 180, by which the MOL contact structures 150 may contact the inter-dielectric layer 180. The MOL contact structures 150 may also contact the BEOL vias 170.

Figure 4F:
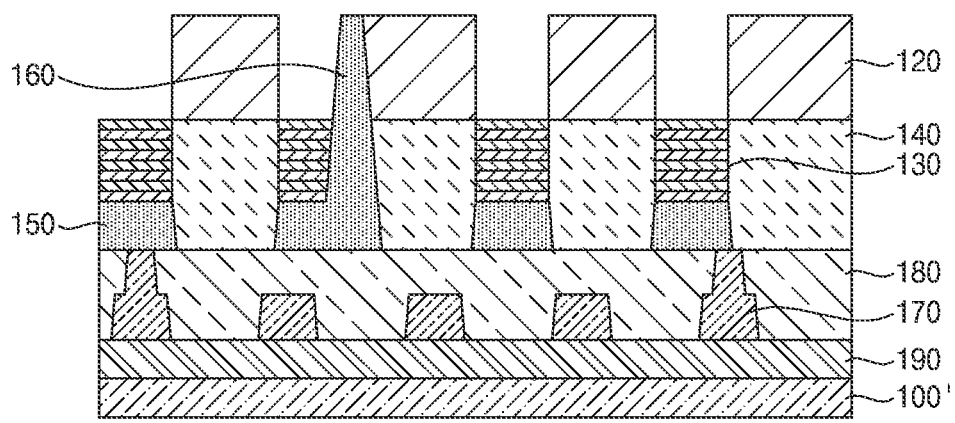

Referring to FIG. 4F, the device substrate 100 may be etched to expose the STI structures 120, the MOL via 160, and the semiconductor devices 130. Top surfaces and side surfaces of the STI structures 120, a top surface and a side surface of the MOL via 160, and top surfaces of the semiconductor device 130 may be exposed. Here, the top surfaces of the STI structures 120 refers to the bottom surface thereof in FIG. 4D, and the top surface of the MOL via 160 refers to the bottom surface thereof in FIG. 4D.

Figure 4G:
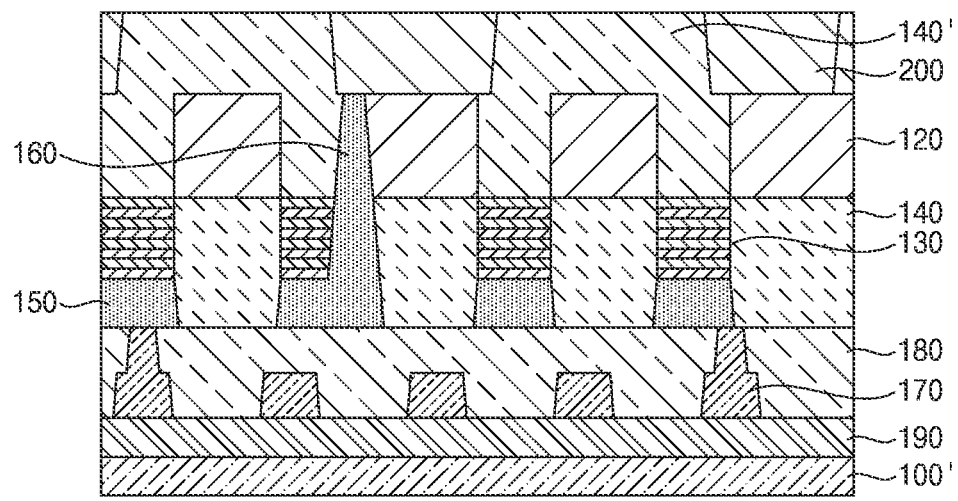

Referring to FIG. 4G, an inter-dielectric layer 140' may be provided on the STI structures 120, the MOL via 160, and the semiconductor devices 130.

In the present operation, the inter-dielectric layer 140' may be patterned to form trenches that expose the top surface of the MOL via 160 and the top surfaces of the STI structures 120. The trenches may be filled with a conductive material to form back side power rails 200. The back side power rails 200 may contact the top surfaces of the MOL via 160 and the top surfaces of the STI structures 120. The back side power rails 200 may be, for example, a through-silicon via (TSV) or a buried power rail (BPR). In addition, the back side power rails 200 may include Cu, Co, W, Mo, and Ru, not being limited thereto. The semiconductor chip in FIG. 4G may be referred to as a first BSPDN semiconductor chip 10.

Figure 4H:
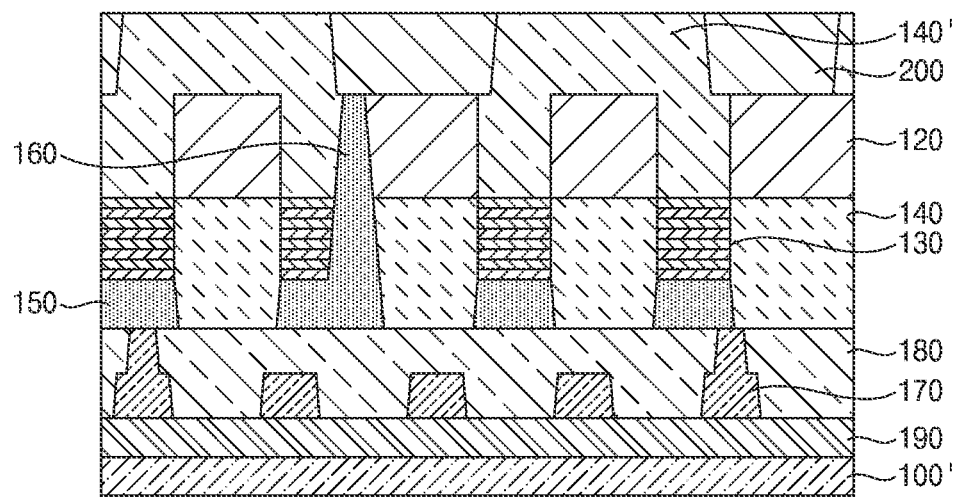

Referring to FIG. 4H, another semiconductor chip may be formed. The semiconductor chip in FIG. 4H may be referred to as a second BSPDN semiconductor chip 10'. The second BSPDN semiconductor chip 10' in FIG. 4H may have substantially the same configuration as the first BSPDN semiconductor chip 10 illustrated in FIG. 4G, and thus, detailed descriptions thereof are omitted.

Figure 4I:
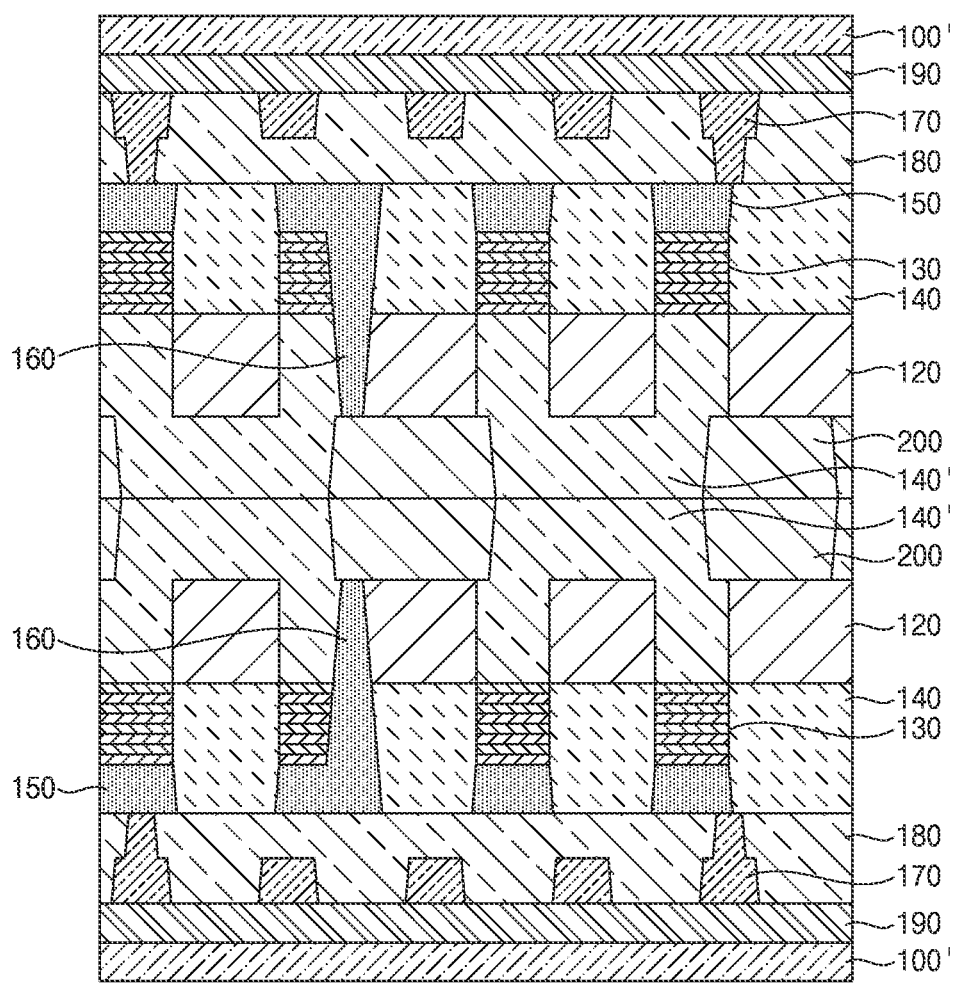

Referring to FIG. 4I, the second BSPDN semiconductor chip 10' in FIG. 4H may be flipped and bonded to the first BSPDN semiconductor chip 10 in FIG. 4G to form a 3D stacked semiconductor chip architecture 1 according to an embodiment. In the 3D stacked semiconductor chip architecture 1, the back side power rails 200 included in the first BSPDN semiconductor chip 10 may be bonded to the back side power rails 200 included in the second BSPDN semiconductor chip 10'. As the back side power rails of the first BSPDN semiconductor chip 10 and the second BSPDN semiconductor chip 10' have a more simplified structure, an alignment between the back side power rails 200 may be improved. Such improvement in the alignment may lead to an improved performance of the 3D stacked semiconductor chip architecture.

Figure 5:
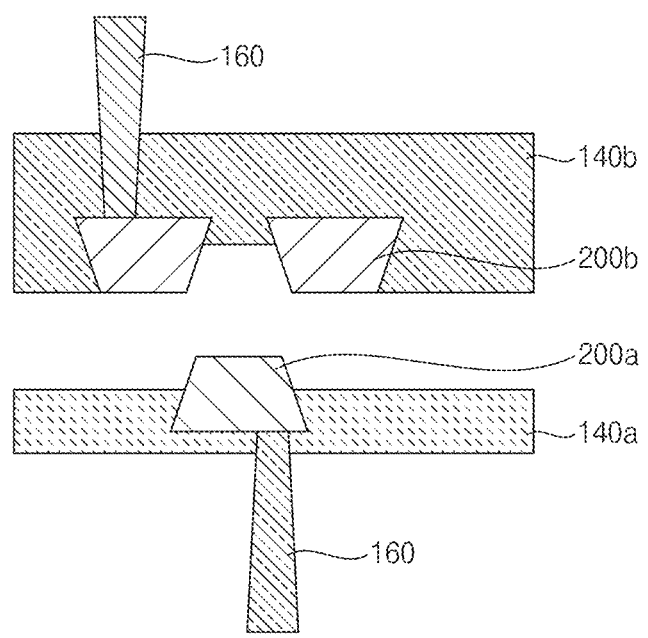
FIG. 5 illustrates a back side power rail structure included in a 3D stacked semiconductor chip architecture according to an example embodiment.

FIG. 5 illustrates a back side power rail structure included in a 3D stacked semiconductor chip architecture according to an embodiment.

Referring to FIG. 5, the back side power rail 200a included in a first BSPDN semiconductor chip may protrude from a surface of the wafer 140a. The back side power rails 200b included in a second BSPDN semiconductor chip may be formed such that a surface of the back side power rail 200b is coplanar with a surface of the wafer 140b. In addition, the back side power rail 200b may include an opening that extends to a portion of the wafer 140b in a vertical direction. The shape and location of the opening may correspond to a the shape and location of the protruded back side power rail 200a included in the first BSPDN semiconductor chip, such that when the first BSPDN semiconductor chip and the second BSPDN semiconductor chip are bonded, the protruded back side power rail 200a fits in the opening formed in the back side power rail 200b.

For example, a slope of a side surface of the back side power rail 200a may be formed to correspond to a slope of a side surface of the back side power rail 200b such that when the back side power rail 200a is fitted into the opening formed in the back side power rail 200b, the back side power rail 200a settles into the opening through sliding. Accordingly, side surfaces of the back side power rail 200a and the back side power rail 200b will self-align with each other and fully contact each other, which may improve the alignment between the first BSPDN and the second BSPDN. However, a shape of the back side power rail 200a and a shape of the opening formed in the back side power rail 200b are not limited thereto. For example, the back side power rail 200a and the opening formed in the back side power rail 200b may have a saw toothed shape, a multi-toothed shape, etc. Shapes of the back side power rail 200a and the opening formed in the back side power rail 200b may be formed by a selective subtractive manufacturing process such as, for example, selective etching using a mask as necessary.

According to the configuration of the back side power rails 200a and back side power rails 200b as illustrated in FIG. 5, an alignment between the first BSPDN semiconductor chip and the second BSPDN semiconductor chip may be further improved.

Figure 6A:
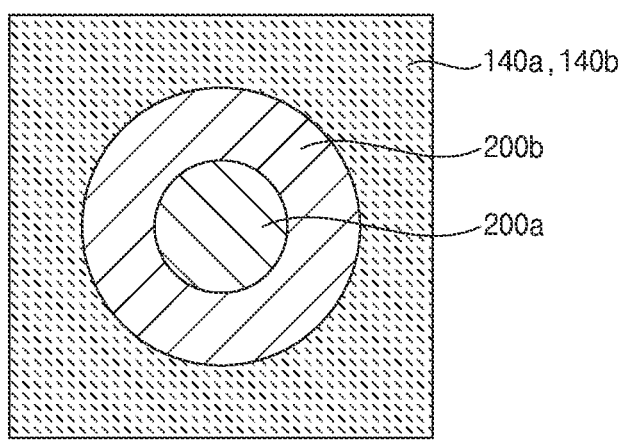
FIGS. 6A and 6B illustrate a plan view of the back side power rail structure included in a 3D stacked semiconductor chip architecture according to example embodiments.
Figure 6B:
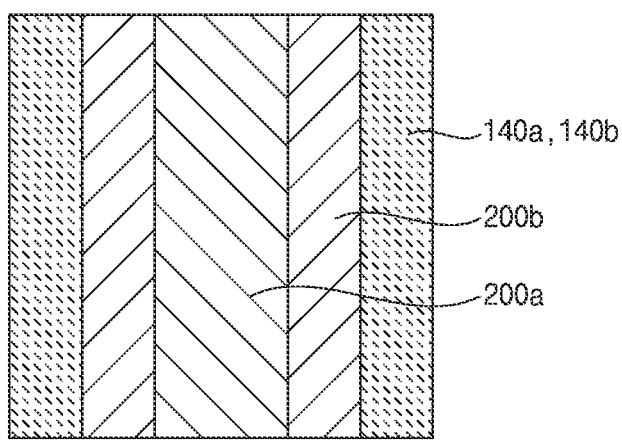

FIGS. 6A and 6B illustrate plan views of back side power rails included in a 3D stacked semiconductor chip architecture according to embodiments, which may correspond to the arrangements shown in FIG. 5.

Referring to FIG. 6A, a back side power rail 200a included in a first BSPDN semiconductor chip may have a circular shape, and a back side power rail 200b included in a second BSPDN semiconductor chip may have a ring shape including a circular opening. The circular opening may extend to a portion of the wafer 140b in a vertical direction and correspond to the circular shape of the back side power rail 200a. When the first BSPDN semiconductor chip is bonded to the second BSPDN semiconductor chip, the circular back side power rail 200a may fit into the circular opening formed in the ring shaped back side power rail 200b.

Referring to FIG. 6B, a back side power rail 200a included in a first BSPDN semiconductor chip may have a rectangular shape extending in a horizontal direction, and back side power rails 200b included in a second BSPDN semiconductor chip may have a rectangular shape extending in the horizontal direction. A rectangular opening may be formed between adjacent back side power rails 200b. The rectangular opening may extend to a portion of the wafer 140b in a vertical direction and correspond to the rectangular shape of the back side power rail 200a. When the first BSPDN semiconductor chip is bonded to the second BSPDN semiconductor chip, the rectangular back side power rail 200a may fit into the rectangular opening formed between adjacent back side power rails 200b.

Figure 7:
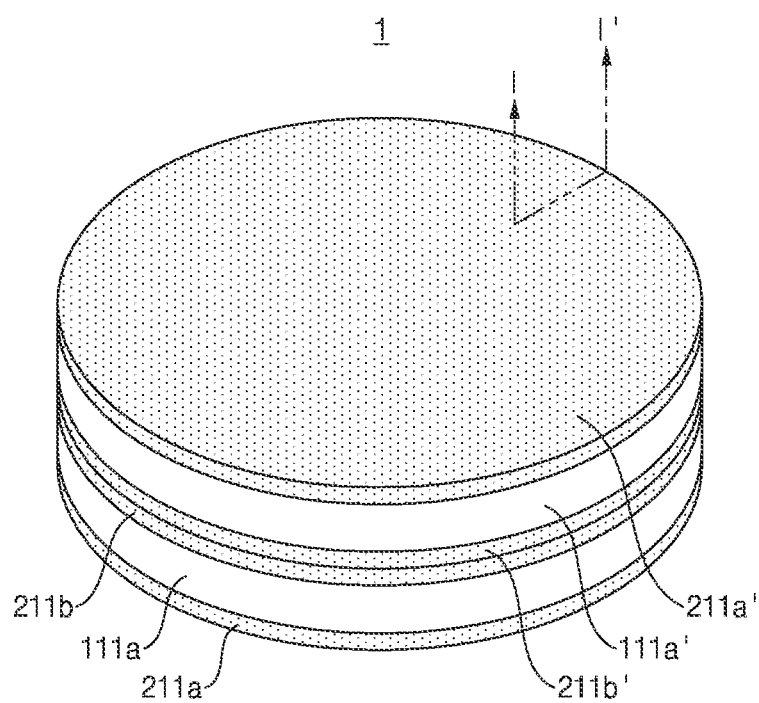
FIG. 7 illustrates a perspective view of the 3D stacked semiconductor chip architecture in FIG. 3 according to an example embodiment.

FIG. 7 illustrates a perspective view of the 3D stacked semiconductor chip architecture in FIG. 3.

As illustrated in FIG. 7, the 3D stacked semiconductor chip architecture may include a first BSPDN semiconductor chip including a semiconductor layer 211a, a wafer 111a, and a back side PDN layer 211b, and a second BSPDN semiconductor chip including a semiconductor layer 211a', a wafer 111a', and a back side PDN layer 211b'. The semiconductor layer 211a and the semiconductor layer 211a' may respectively include an FEOL layer, an MOL layer, and a BEOL layer.

The wafer 111a and the wafer 111a' may include, for example, a silicon (Si) substrate, not being limited thereto. As illustrated in FIG. 7, the wafer 111a and the wafer 111a' may be a circular panel, but the shape of the wafer 111a and the wafer 111a' may not be limited thereto. For example, the wafer 111a and the wafer 111a' may be a tetragonal panel. The wafer 111a and the wafer 111a' may respectively include a single layer or multiple layers. FIG. 3 illustrates a cross-sectional view of I-I' in FIG. 7.

Figure 8:
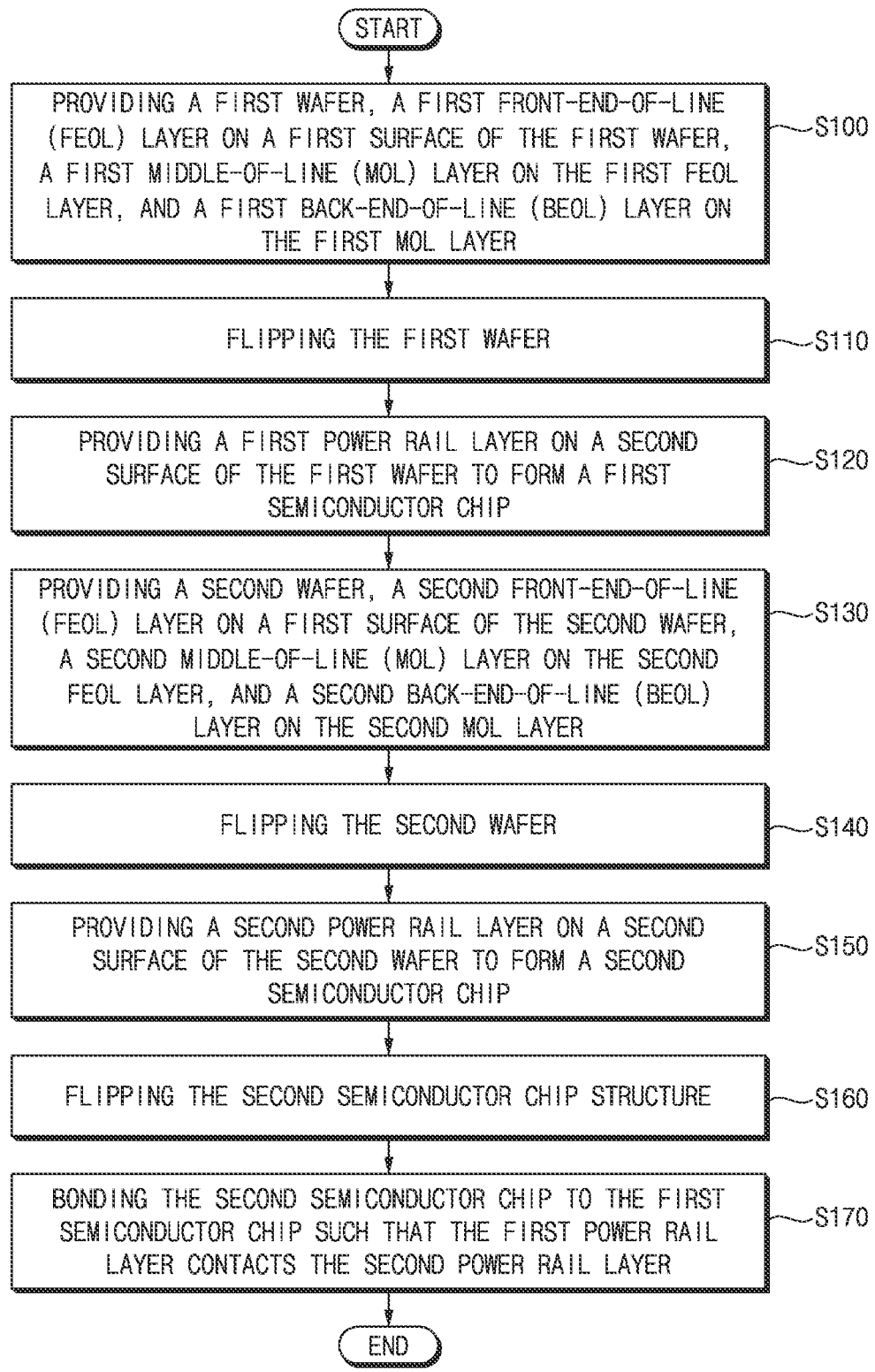
FIG. 8 illustrates a flowchart of a method of manufacturing a 3D stacked semiconductor chip architecture according to an example embodiment.

FIG. 8 illustrates a flowchart of a method of manufacturing a 3D stacked semiconductor chip architecture according to an embodiment.

The method may include providing a first BSPDN semiconductor chip including a first wafer, a first FEOL layer on a first side of the first wafer, a first MOL layer on the first FEOL layer, and a first BEOL layer on the first MOL layer (S100).

The first wafer may be flipped (S110). A first power rail layer may be provided on a second side of the first wafer (S120).

The method may further include providing a second BSPDN semiconductor chip including a second wafer, a second FEOL layer on a first side of the second wafer, a second MOL layer on the second FEOL layer, and a second BEO) layer on the second MOL layer (S130).

The second wafer may be flipped (S140). A second power rail layer may be provided on a second side of the second wafer (S150).

The method may further include flipping the second BSPDN semiconductor chip (S160) and bonding the second BSPDN semiconductor chip to the first BSPDN semiconductor chip such that the second power rail layer contacts the first power rail layer (S170).

Figure 9:
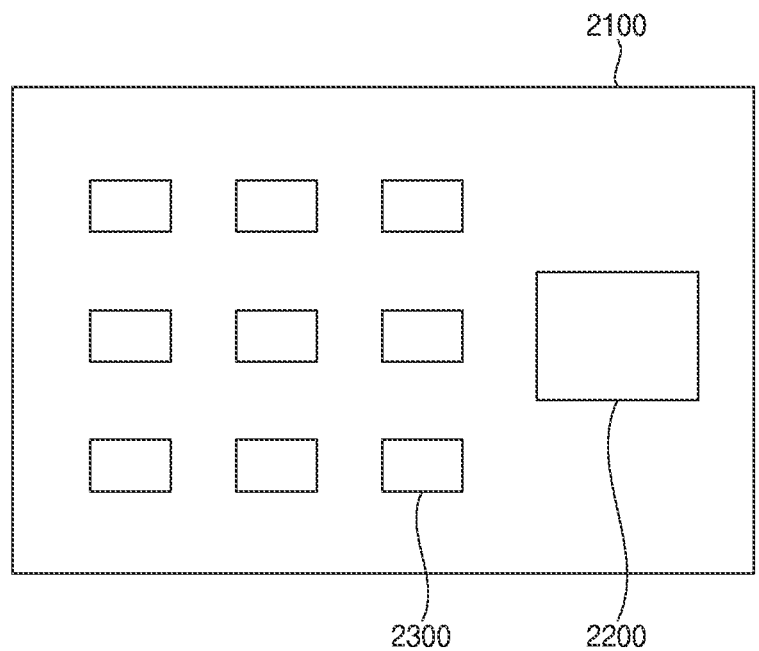
FIG. 9 illustrates a semiconductor architecture that may incorporate the 3D stacked semiconductor chip architecture according to example embodiments.

FIG. 9 illustrates a semiconductor chip that may incorporate a 3D stacked semiconductor chip architecture according to embodiments.

Referring to FIG. 9, a semiconductor package 2000 according to an embodiment may include a processor 2200 and semiconductor devices 2300 that are mounted on a substrate 2100. The processor 2200 and/or the semiconductor devices 2300 may include one or more of a 3D stacked semiconductor chip architecture described in the above embodiments FIG. 10 illustrates a schematic block diagram of an electronic system according to an embodiment.

Figure 10:
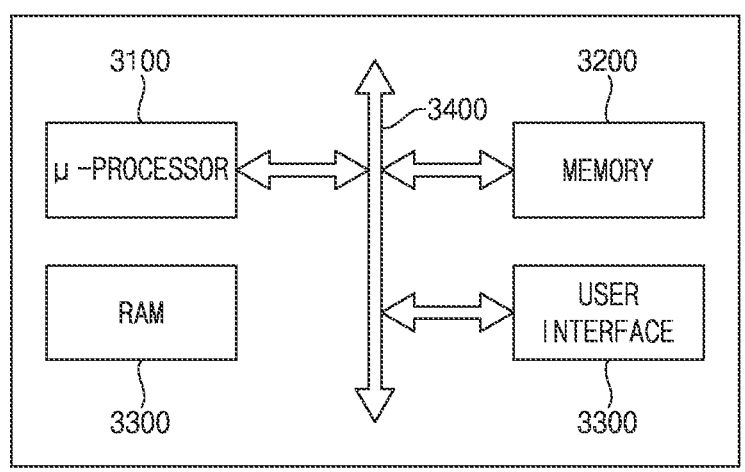
FIG. 10 illustrates a schematic block diagram of an electronic system according to an example embodiment.

Referring to FIG. 10, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include a 3D stacked semiconductor chip architecture as described in the above embodiments.

It should be understood that embodiments described herein should be considered in a descriptive sense only and not for purposes of limitation. Descriptions of features or aspects within each embodiment should typically be considered as available for other similar features or aspects in other embodiments.

While embodiments have been described with reference to the figures, it will be understood by those of ordinary skill in the art that various changes in form and details may be made therein without departing from the spirit and scope as defined by the following claims and their equivalents.

What is claimed is:

1. A three-dimensionally (3D) stacked semiconductor chip architecture comprising:
   a first semiconductor chip comprising:
   a first semiconductor layer;
   a first front-end-of-line (FEOL) layer provided on a first side of the first semiconductor layer;
   a first middle-of-line (MOL) layer provided on the first FEOL layer;
   a first back-end-of-line (BEOL) layer provided on the first MOL layer;
   a first power rail layer provided on a second side of the first semiconductor layer;
   a second semiconductor chip comprising:
   a second semiconductor layer;
   a second FEOL layer provided on a first side of the second semiconductor layer;
   a second MOL layer provided on the second FEOL layer;
   a second BEOL layer provided on the second MOL layer;
   a second power rail layer provided on a second side of the second semiconductor layer,
   wherein the first power rail layer and the second power rail layer contact each other,
   wherein the first power rail layer comprises a first power rail configured to distribute power, and the second power rail layer comprises a second power rail configured to distribute power, and
   wherein an entirety of the first power rail is parallel to an entirety of the second power rail.

2. The 3D stacked semiconductor chip architecture of claim 1,
   wherein the first semiconductor chip further comprises a first interdielectric layer on side surfaces of the first power rail,
   wherein the second semiconductor chip further comprises a second interdielectric layer on side surfaces of the second power rail, and
   wherein the first interdielectric layer directly contacts the second interdielectric layer.

3. The 3D stacked semiconductor chip architecture of claim 2, wherein the first power rail contacts the second power rail.

4. The 3D stacked semiconductor chip architecture of claim 2, wherein the first power rail protrudes from a surface on the second side of the first semiconductor layer in a vertical direction, and
   wherein the second power rail comprises openings that extend through a portion of the second semiconductor layer in the vertical direction.

5. The 3D stacked semiconductor chip architecture of claim 4, wherein a shape of the first power rail corresponds to a shape of the openings, and
   wherein the first power rail is inserted into an opening of the openings and contacts the second power rail.

6. The 3D stacked semiconductor chip architecture of claim 5, wherein the first power rail has a circular shape, and
   wherein the second power rail has a ring shape and comprises the opening having a circular shape, the circular shape of the opening corresponding to the circular shape of the first power rail.

7. The 3D stacked semiconductor chip architecture of claim 5, wherein the first power rail has a rectangular shape,
   wherein the second power rail has a rectangular shape, and
   wherein the opening having a rectangular shape is between the second power rail and an adjacent second power rail, the rectangular shape of the opening corresponding to the rectangular shape of the first power rail.

8. The 3D stacked semiconductor chip architecture of claim 2, wherein the first semiconductor layer and the second semiconductor layer comprise an inter-dielectric layer.

9. The 3D stacked semiconductor chip architecture of claim 2, wherein the first power rails and the second power rails comprise one of copper (Cu), cobalt (Co), tungsten (W), and ruthenium (Ru).

10. The 3D stacked semiconductor chip architecture of claim 1, wherein the first semiconductor chip and the second semiconductor chip are back side power distribution network (BSPDN) semiconductor chips.

11. A three-dimensionally (3D) stacked semiconductor chip architecture comprising:
    a first semiconductor chip comprising:
    a first semiconductor layer;
    a first front-end-of-line (FEOL) layer provided on a first side of the first semiconductor layer;

a first middle-of-line (MOL) layer provided on the first FEOL layer;

a first back-end-of-line (BEOL) layer provided on the first MOL layer;

a plurality of first power rails provided on a second side of the first semiconductor layer, the plurality of first power rails configured to distribute power; and a second semiconductor chip provided on the first semiconductor chip, the second semiconductor chip comprising:

a second semiconductor layer;

a second FEOL layer provided on a first side of the second semiconductor layer;

a second MOL layer provided on the second FEOL layer;

a second BEOL layer provided on the second MOL layer;

a plurality of second power rails provided on a second side of the second semiconductor layer, the plurality of second power rails configured to distribute power, wherein the plurality of first power rails and the plurality of second power rails contact each other, wherein the plurality of first power rails protrude from a surface on the second side of the first semiconductor layer in a vertical direction, wherein the plurality of second power rails comprise openings that extend through a portion of the second semiconductor layer in the vertical direction, and wherein the first semiconductor chip further comprises a first interdielectric layer on side surfaces of the plurality of first power rails, wherein the second semiconductor chip further comprises a second interdielectric layer on side surfaces of the plurality of second power rails, and wherein the first interdielectric layer directly contacts the second interdielectric layer.

* * * * *